(12) United States Patent
Fuller et al.

(10) Patent No.: US 8,334,090 B2
(45) Date of Patent: Dec. 18, 2012

(54) MIXED LITHOGRAPHY WITH DUAL RESIST AND A SINGLE PATTERN TRANSFER

(75) Inventors: Nicholas C. Fuller, North Hills, NY (US); Michael A. Guillorn, Yorktown Heights, NY (US); Balasubramanian S. Pranatharthi Haran, Watervliet, NY (US); Jyotica V. Patel, Port Chester, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 13/015,668

(22) Filed: Jan. 28, 2011

(65) Prior Publication Data
US 2011/0123779 A1      May 26, 2011

Related U.S. Application Data

(62) Division of application No. 11/867,428, filed on Oct. 4, 2007, now Pat. No. 7,914,970.

(51) Int. Cl.
*G03C 5/00* (2006.01)
(52) U.S. Cl. ............... 430/272.1; 430/271.1; 430/273.1; 430/296; 430/302; 430/310; 430/312; 430/313; 430/314; 430/317; 430/942; 428/195.1
(58) Field of Classification Search ............... 430/271.1, 430/272.1, 273.1, 296, 302, 310, 312, 313, 430/314, 317, 942, 9, 11, 14, 17; 428/195.1
See application file for complete search history.

(56) References Cited

U.S. PATENT DOCUMENTS

| | | | |
|---|---|---|---|
| 6,794,230 B2 | 9/2004 | Huang et al. | |
| 7,914,970 B2 * | 3/2011 | Fuller et al. | 430/296 |

OTHER PUBLICATIONS

Gourgon, C., et al., "Influence of Pattern Density in Nanoimprint Lithography" American Vacuum Society, Journal of Vacuum Science Technology (2003) pp. 98-105, vol. B 21(1).
Grigorescu, A.E., et al., "Sub-10 nm Linewidth in HSQ, Using Electron Beam Lithography" MINE '06 Micro- and Nano-Engineering, P-EIBL07, Electron and Ion Beam Lithography.
Wenchuang, (Walter) H., et al., "Sub-10nm Electron Beam Lithography Using Cold Development of Poly (methylmethacrylate)" American Vacuum Society, Journal of Vacuum Science Technology (2004) pp. 1711-1716, vol. B 22(4).

* cited by examiner

*Primary Examiner* — Christopher Young
(74) *Attorney, Agent, or Firm* — Scully, Scott, Murphy & Presser, P.C.; Vazken Alexanian (57) ABSTRACT

An inorganic electron beam sensitive oxide layer is formed on a carbon based material layer or an underlying layer. The inorganic electron beam sensitive oxide layer is exposed with an electron beam and developed to form patterned oxide regions. An ultraviolet sensitive photoresist layer is applied over the patterned oxide regions and exposed surfaces of the carbon based material layer, and subsequently exposed with an ultraviolet radiation and developed. The combined pattern of the patterned ultraviolet sensitive photoresist and the patterned oxide regions is transferred into the carbon based material layer, and subsequently into the underlying layer to form trenches. The carbon based material layer serves as a robust mask for performing additional pattern transfer into the underlying layer, and may be easily stripped afterwards. The patterned ultraviolet sensitive photoresist, the patterned oxide regions, and the patterned carbon based material layer are subsequently removed.

10 Claims, 12 Drawing Sheets

MIXED LITHOGRAPHY WITH DUAL RESIST AND A SINGLE PATTERN TRANSFER

CROSS REFERENCE TO RELATED APPLICATION

This application is a divisional of U.S. patent application Ser. No. 11/867,428, filed Oct. 4, 2007 the entire content and disclosure of which is incorporated herein by reference.

FIELD OF THE INVENTION

The present invention relates to semiconductor processing methods, and particularly to mixed lithography with dual resist and a single pattern transfer, and structures for the same.

BACKGROUND OF THE INVENTION

Mixed lithography is a term broadly applied to lithographic processes that use two or more different exposure sources to create a composite image in a single layer of resist. Once the lithographic patterning is complete, the composite image is developed and the pattern is transferred into an underlying layer. This process can be used to exploit advantages of different lithography techniques without employing two separate pattern transfer steps. A common example of mixed lithography involves combining deep ultra violet (DUV) photolithography and electron beam lithography (EBL) in a single layer of resist.

Negative-tone chemically amplified resists are commonly used in mixed lithography processes combining DUV photolithography and electron beam lithography. When a negative tone resist is employed in lithography, portions of the resist that are exposed to a light beam remain on an underlayer, while unexposed portions of the resist are removed during resist development. A collective set of remaining portions of the resist is subsequently used as an etch mask for pattern transfer into the underlayer.

A typical process flow for mixed lithography using a negative tone chemically amplified resist is shown below:

(a) Application of a resist and performing a post application bake (PAB)
(b) Exposure of the resist with an electron beam and a first post-exposure bake (PEB)
(c) Exposure of the resist with a DUV beam and a second post-exposure bake (PEB)
(d) A single RIE process to transfer the pattern in the resist into one or more underlying layers on a substrate.

FIGS. 1A-1F show sequential vertical cross-sectional views of an exemplary prior art structure showing processing steps of conventional mixed lithography employing a negative-tone chemically amplified resist. The negative tone chemically amplified resist comprises at least one polymeric compound that is sensitive to both electron beam exposure and ultraviolet exposure. An example of the negative tone chemically amplified resist is commercially available NEB-22A5™ resist from Sumitomo Chemical Company.

Figure 1A:
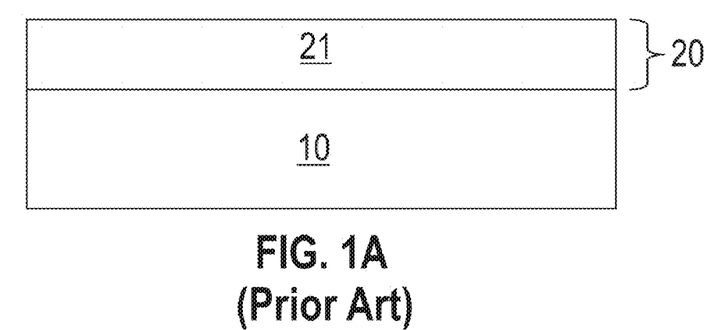
FIGS. 1A-1F are sequential vertical cross-sectional views of an exemplary prior art structure showing processing steps of conventional mixed lithography.

Referring to FIG. 1A, a negative tone chemically amplified resist is applied to an underlying layer 10 to form a negative tone chemically amplified resist layer 20. The negative tone chemically amplified resist layer 20 consists of unexposed negative tone resist region 21, which is contiguous throughout the negative tone chemically amplified resist layer 20 at this point. Typically, the thickness of the negative tone chemically amplified resist layer 20 may be about 100 nm or greater. A post-application bake is performed to stabilize the negative tone chemically amplified resist layer 20 at a temperature from about 70° C. to about 150° C. for a time period from about 30 seconds to about 120 seconds. The process parameters of the post-application bake may be optimized for performance.

Figure 1B:
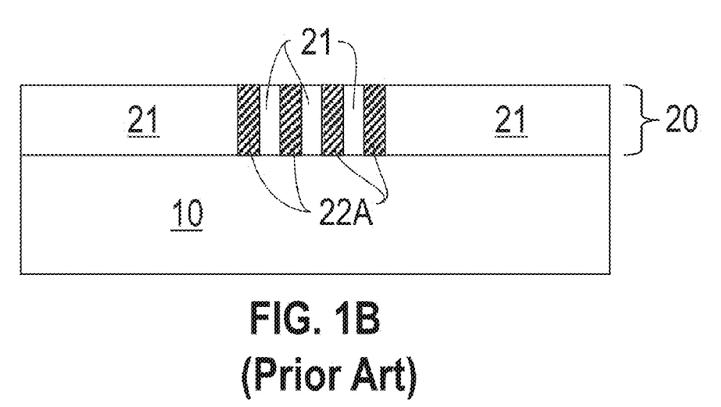

Referring to FIG. 1B, portions of the negative tone chemically amplified resist layer 20 are exposed with an electron beam to form a pattern of electron beam exposed negative tone resist regions 22A, i.e., a pattern of exposed portions of the negative tone chemically amplified resist layer 20, within a template of unexposed negative tone resist region 21, which excludes the exposed portions of the negative tone chemically amplified resist layer 20. Due to smaller wavelength of the electron beam, the resolution of the electron beam exposed pattern is higher than the resolution that is achievable with ultraviolet radiation. Electron beam radiation induced chemical changes occur in the electron beam exposed negative tone resist regions 22A. The electron beam radiation induced changes may be cross-linking of copolymers, chain scission, ring opening of an aryl moiety, or a combination thereof. A first post-exposure bake is performed to diffuse photoacid in the negative tone chemically amplified resist layer 20 and to facilitate the radiation induced changes. For example, the first post-exposure bake may be performed at a temperature from about 70° C. to about 150° C. for a time period from about 30 seconds to about 120 seconds.

Figure 1C:
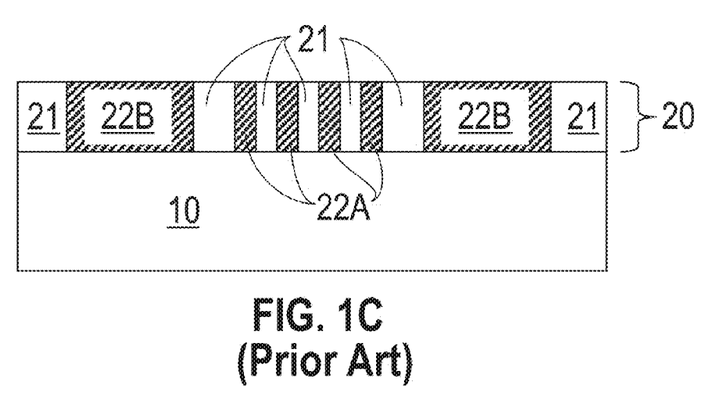

Referring to FIG. 1C, portions of the negative tone chemically amplified resist layer 20 are exposed with an ultraviolet (UV) radiation in a conventional ultraviolet lithography to form a pattern of template of unexposed negative tone resist region 21. UV radiation induced chemical changes occur in the UV exposed negative tone resist regions 22B. The UV radiation induced changes may be cross-linking of copolymers, chain scission, ring opening of an aryl moiety, or a combination thereof, as in the electron beam exposed negative tone resist regions 22B. A first post-exposure bake is performed to diffuse photoacid in the negative tone chemically amplified resist layer 20 and to facilitate the radiation induced changes. For example, the first post-exposure bake may be performed at a temperature from about 70° C. to about 100° C. for a time period from about 30 seconds to about 120 seconds.

Figure 1D:
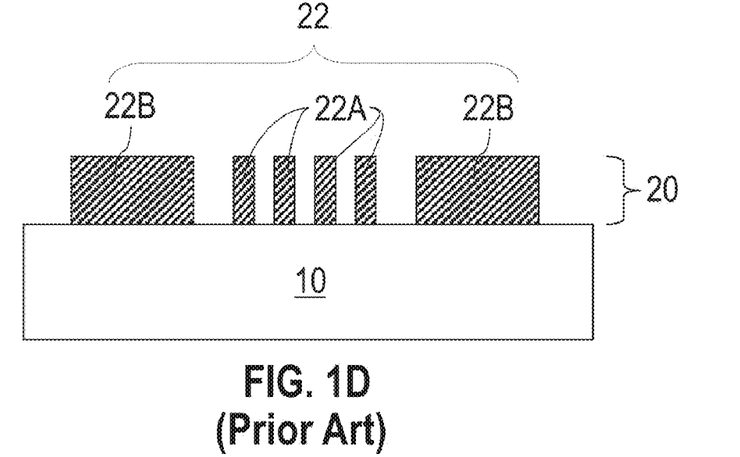

Referring to FIG. 1D, the negative tone chemically amplified resist layer 20 is developed to remove the template of unexposed negative tone resist region 21 selective to exposed negative tone resist regions 22, which comprise the electron beam exposed negative tone resist regions 22A and the UV exposed negative tone resist regions 22B. After the development, the negative tone chemically amplified resist layer 20 consists of exposed negative tone resist regions 22.

Figure 1E:
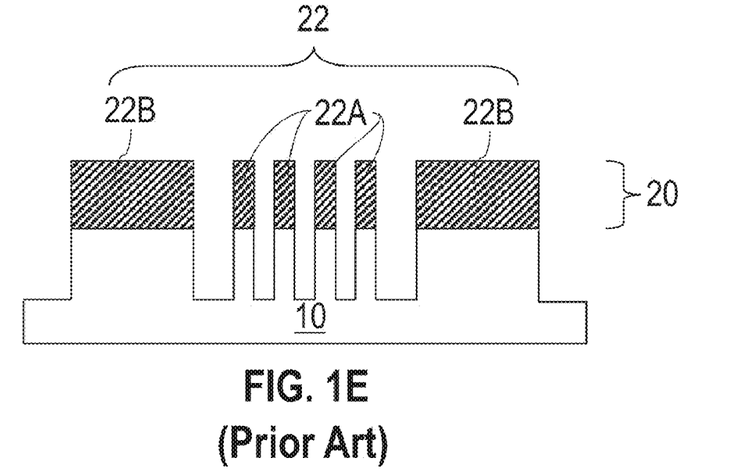

Referring to FIG. 1E, the negative tone chemically amplified resist layer 20 is employed as an etch mask during a reactive ion etch to form trenches in the underlying layer 10 corresponding to the pattern in the negative tone chemically amplified resist layer 20.

Figure 1F:
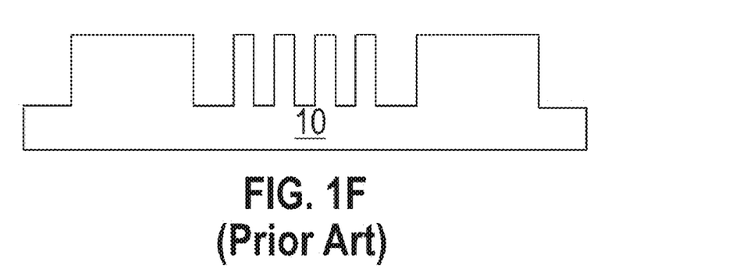

Referring to FIG. 1F, the negative tone chemically amplified resist layer 20 is removed. The underlying layer 10 has a combined pattern of the electron beam lithography and the conventional ultraviolet lithography.

Two primary problems exist with the negative-tone chemically amplified resist-based mixed lithography scheme. (1) Only a single exposure process can be optimized at any one time. For example, good processing parameters for the electron beam exposure preclude the patterning of high resolution features using optical lithography and visa versa. (2) High resolution features at dense pitches experience pattern collapse due to mechanical failure of the resist structures during the develop process. This is driven by the density and aspect ratio of the developed resist features and the capillary force created during the post develop rinsing.

Figure 2:
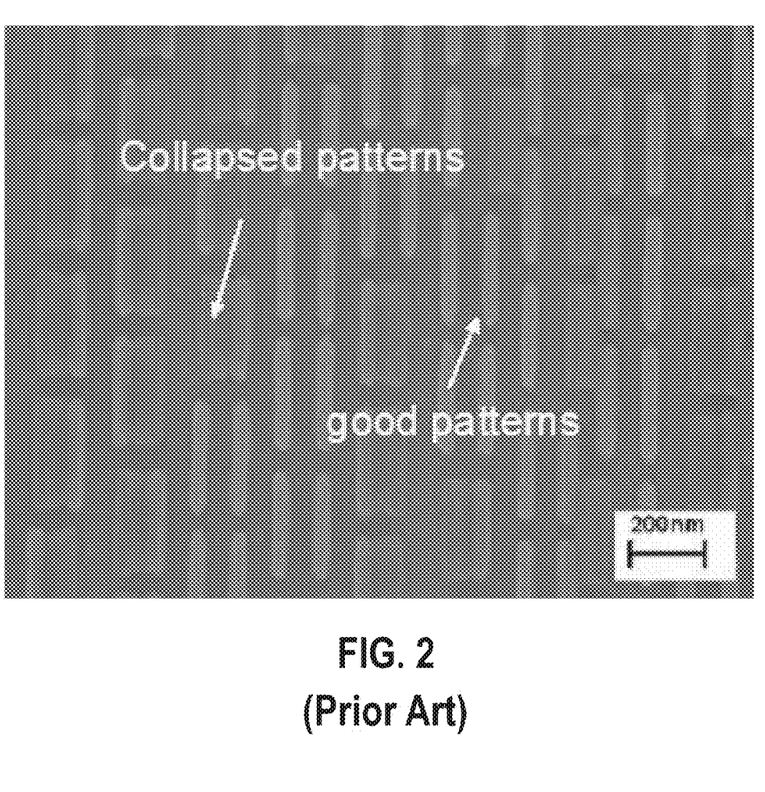
FIG. 2 is a top-down scanning electron micrograph (SEM) of an exemplary prior art developed pattern in which a portion of a negative tone chemically amplified resist collapsed.

FIG. 2 shows an example of a failed pattern in which portions of a developed pattern of a negative tone chemically amplified resist layer collapsed. In this example, 30 nm wide lines having a pitch of 100 nm consistently fail to yield for the negative tone chemically amplified resist layer having a thickness of 100 nm or greater. While thinning down the negative tone chemically amplified resist layer can mitigate this problem, the performance of chemically amplified resists degrades as the film thickness decreases.

In view of the above, there exists a need for methods of mixed lithography with which patterns of electron beam lithography and ultraviolet lithography may be printed without loss of resolution, and structures for the same.

Further, there exists a need for methods of mixed lithography for preventing or circumventing pattern collapses in the resist to enable printing of high resolution features at dense pitches, and structure for the same.

SUMMARY OF THE INVENTION

The present invention addresses the needs described above by providing methods of mixed lithography employing dual resist and a single pattern transfer into an underlying layer, and structures for the same. Specifically, to circumvent the limitations of the negative tone resist based mixed lithography process of the prior art, methods of mixed lithography that utilize two resist materials, while only requiring a single pattern transfer step, i.e., an etch step, are provided.

In the present invention, an inorganic electron beam sensitive oxide layer is formed on an underlying layer. A carbon based material layer may be present between the inorganic electron beam sensitive oxide layer and the underlying layer, or alternately, the inorganic electron beam sensitive oxide layer may be located directly on the underlying layer. The inorganic electron beam sensitive oxide layer is exposed with an electron beam and developed to form patterned oxide regions. An ultraviolet sensitive photoresist layer is applied over the patterned oxide regions and exposed surfaces of the carbon based material layer, and subsequently exposed with an ultraviolet radiation and developed. The combined pattern of the patterned ultraviolet sensitive photoresist and the patterned oxide regions is transferred into the carbon based material layer, and subsequently into the underlying layer to form trenches. The patterned oxide regions have small aspect ratios typically on the order of 3 or less, and consequently, are less prone to pattern collapse than conventional negative tone chemically amplified resist. The carbon based material layer serves as a robust mask for performing additional pattern transfer into the underlying layer, and may be easily stripped from the underlying layer at the conclusion of the patterning process. The patterned ultraviolet sensitive photoresist, the patterned oxide regions, and the patterned carbon based material layer are subsequently removed.

According to one embodiment of the present invention, a method of forming a lithographic pattern is provided, which comprises:

applying a carbon based material layer directly on an underlying layer;

applying an inorganic electron beam sensitive oxide layer directly on the carbon based material layer;

exposing at least one inorganic electron beam sensitive oxide portion with an electron beam;

developing the inorganic electron beam sensitive oxide layer;

applying an optical resist layer directly on the at least one exposed inorganic electron beam sensitive oxide portion and the carbon based material layer;

exposing at least one optical resist portion with an optical beam; and developing the optical resist layer and forming at least one patterned optical resist portion.

In one embodiment, the method further comprises etching, by a first etch, the carbon based material layer employing a set of the exposed at least one inorganic electron beam sensitive oxide portion and the at least one patterned optical resist portion as an etch mask for the first etch.

In another embodiment, the first etch is an anisotropic reactive ion etch.

In even another embodiment, the method further comprises transferring a pattern of the etch mask into the underlying layer by a second etch.

In yet another embodiment, the second etch is an anisotropic reactive ion etch.

In still another embodiment, the set of the exposed at least one inorganic electron beam sensitive oxide portion and the at least one patterned optical resist portion is employed as an etch mask for the second etch.

In still yet another embodiment, the method further comprises removing the at least one patterned optical resist portion after the first etch and prior to the second etch.

In a further embodiment, the exposed at least one inorganic electron beam sensitive oxide portion is completely removed during the second etch.

In an even further embodiment, the at least one patterned optical resist portion is at least partially removed.

In a yet further embodiment, the at least one patterned optical resist portion is completely removed.

In a still further embodiment, the inorganic electron beam sensitive oxide layer comprises hydrogen silsesquioxane (HSQ).

In a still yet further embodiment, the inorganic electron beam sensitive oxide layer comprises one of aluminum fluoride, zinc oxide, and titanium oxide.

In another further embodiment, the carbon based material layer comprises near frictionless carbon (NFC).

In even another further embodiment, the carbon based material layer comprises one of an organic carbon containing material and graphite.

In yet another further embodiment, the at least one exposed inorganic electron beam sensitive oxide portion is disjoined from the at least one patterned optical resist portion.

In still another further embodiment, the underlying layer is one of a semiconductor layer, an insulator layer, a metal layer, a polymer layer, and a stack thereof.

In still yet another further embodiment, the carbon based material layer has a thickness from about 40 nm to about 400 nm, and the inorganic electron beam sensitive oxide layer has a thickness from about 10 nm to about 200 nm.

In a further embodiment, the optical resist layer is sensitive to at least to one of broadband ultraviolet radiation, 436 nm wavelength g-line ultraviolet radiation, 365 nm wavelength i-line ultraviolet radiation, 248 nm wavelength KrF excimer ultraviolet radiation, 193 nm wavelength ArF excimer ultraviolet radiation, 157 nm wavelength F2 laser, and extreme ultraviolet radiation.

According to another aspect of the present invention, another method of forming a lithographic pattern is provided, which comprises:

applying an inorganic electron beam sensitive oxide layer directly on an underlying layer;

exposing at least one inorganic electron beam sensitive oxide portion with an electron beam;

developing the inorganic electron beam sensitive oxide layer;

applying an optical resist layer directly on the at least one exposed portion and the underlying layer;

exposing at least one optical resist portion with an optical beam; and developing the optical resist layer and forming at least one patterned optical resist portion.

In one embodiment, the method further comprises etching, by an etch, the underlying layer employing a set of the exposed at least one inorganic electron beam sensitive oxide portion and the at least one patterned optical resist portion as an etch mask for the etch.

In another embodiment, the exposed at least one inorganic electron beam sensitive oxide portion is completely removed during the etch.

According to even another aspect of the present invention, a lithographic structure is provided, which comprises:

a carbon based material layer vertically abutting an underlying layer;

at least one inorganic electron beam sensitive oxide portion having a pattern and vertically abutting the carbon based material layer; and at least one patterned optical resist portion having another pattern and located on the carbon based material layer.

In one embodiment, the at least one patterned optical resist portion is disjoined from the at least one inorganic electron beam sensitive oxide portion.

In another embodiment, the at least one patterned optical resist portion is sensitive to at least to one of broadband ultraviolet radiation, 436 nm wavelength g-line ultraviolet radiation, 365 nm wavelength i-line ultraviolet radiation, 248 nm wavelength KrF excimer ultraviolet radiation, 193 nm wavelength ArF excimer ultraviolet radiation, 157 nm wavelength F2 laser, and extreme ultraviolet radiation.

In even another embodiment, the underlying layer comprises at least one trench having a composite pattern comprising the pattern and the another pattern.

According to yet another aspect of the present invention, a lithographic structure is provided, which comprises:

at least one inorganic electron beam sensitive oxide portion having a pattern and vertically abutting an underlying layer; and at least one patterned optical resist portion having another pattern and located on the underlying layer.

BRIEF DESCRIPTION OF THE DRAWINGS

FIGS. 5-7 are second through fourth variations on the first exemplary semiconductor structure.

DETAILED DESCRIPTION OF THE INVENTION

As stated above, the present invention relates to mixed lithography with dual resist and a single pattern transfer, and structures for the same, which is now described in detail with accompanying figures. It is noted that like and corresponding elements are referred to by like reference numerals.

Figure 3A:
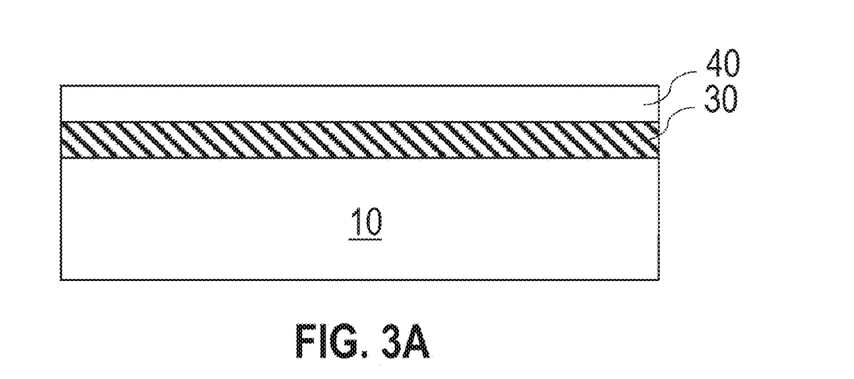
FIGS. 3A-3H are sequential vertical cross-sectional views of a first exemplary lithographic structure according to the present invention at various stages of a manufacturing process.

Referring to FIG. 3A, a first exemplary lithographic structure according to the present invention comprises a stack of an underlying layer 10, a carbon based material layer 30, and an inorganic electron beam sensitive oxide layer 40. The underlying layer 10 may comprise a semiconductor layer, an insulator layer, or a metal layer. The underlying layer 10 may also comprise a patterned mixture of multiple layers having different compositions. The underlying layer 10 may be located on a semiconductor substrate, and may be formed during a front-end-of-line (FEOL) processing step or a back-end-of-line (BEOL) processing step.

The carbon based material layer 30 may be any material that can be patterned using the inorganic electron beam sensitive oxide layer 40 as a mask. This includes a variety of spin-on polymers and plasma deposited carbon based materials. Specifically, the carbon based material layer 30 may comprise one of near frictionless carbon (NFC), an organic carbon containing material, graphite, and a mixture thereof. The thickness of the carbon based material layer 30 may be from about 20 nm to about 500 nm, and preferably from about 50 nm to about 300 nm, although lesser and greater thicknesses are also contemplated herein.

Near frictionless carbon, which was first developed in Argonne National Laboratory in 1997. Near frictionless carbon may be formed from a mixture of hydrocarbon gases in a plasma chamber. Near frictionless carbon is also commercially available as a spin-on polymer. Near frictionless carbon has an extremely low friction coefficient, which is conjectured to be due to at least one hydrogen atom that loses the electron to an adjacent carbon, leaving the positively charged hydrogen nucleus exposed. The carbon based material layer 20 is subsequently patterned, and is employed as an etch mask template during an etch of the underlying layer 10, as will be described below.

The inorganic electron beam sensitive oxide layer 40 is formed on the carbon based material layer 30. The inorganic electron beam sensitive oxide layer 40 comprises an inorganic resist containing an inorganic oxide, and is sensitive to an electron beam radiation. The inorganic electron beam sensitive oxide layer 40 may comprise hydrogen sesquioxane (HSQ), or other electron beam sensitive oxide such as aluminum fluoride (AlF), zinc oxide (ZrO), and titanium oxide (TiO$_2$). In general, the inorganic resist in the inorganic electron beam sensitive oxide layer 40 can be used as a high resolution patterning materials for electron beam lithography and, in the case of HSQ, also be used for printing patterns using 157 nm deep ultraviolet (DUV), extreme ultraviolet (EUV) and X-ray lithography. The inorganic electron beam sensitive oxide layer 40 can be made quite thin, avoiding pattern collapse problems associated with thicker resists in the prior art. The inorganic electron beam sensitive oxide layer 40 may be spin-coated or sputter deposited. The thickness of the inorganic electron beam sensitive oxide layer 40 may be from about 10 nm to about 100 nm, although lesser and greater thicknesses are explicitly contemplated herein also. The composition and thickness of the inorganic electron beam sensitive oxide layer 40 may be optimized for electron beam lithography without regard to optical lithography.

Methods of application of the inorganic electron beam sensitive oxide layer 40 are known in the art. For example, Grigorescu et al., "Sub 10-nm linewidth in HSQ, using Electron Beam Lithography," MINE '06 Micro- and Nano-Engineering, P-EIBL07 discloses a method of applying hydrogen sesquioxane (HSQ) for electron beam lithography, and is herein incorporated by reference.

Figure 3B:
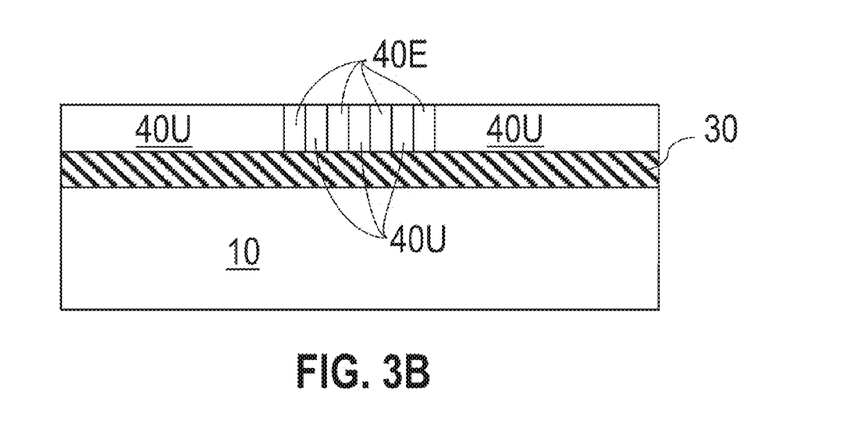

Referring to FIG. 3B, employing techniques of electro beam lithography, at least one portion of the inorganic electron beam sensitive oxide layer 40 is exposed with an electron beam. The at least exposed portions of the inorganic electron beam sensitive oxide layer 40 is herein referred to as at least one exposed inorganic electron beam sensitive oxide portion 40E. The complement of the at least one exposed inorganic electron beam sensitive oxide portion 40P within the at least exposed portions of the inorganic electron beam sensitive oxide layer 40 is herein referred to as at least one unexposed inorganic electron beam sensitive oxide portion 40U. The electron beam causes chemical changes in the at least one exposed inorganic electron beam sensitive oxide portion 40E such that the at least one exposed inorganic electron beam sensitive oxide portion 40E has a higher etch resistivity to at least one etch chemistry relative to the at least one unexposed inorganic electron beam sensitive oxide portion 40U. The pattern formed by the at least one exposed inorganic electron beam sensitive oxide portion 40E has a resolution and feature sizes of the electron beam lithography.

Figure 3C:
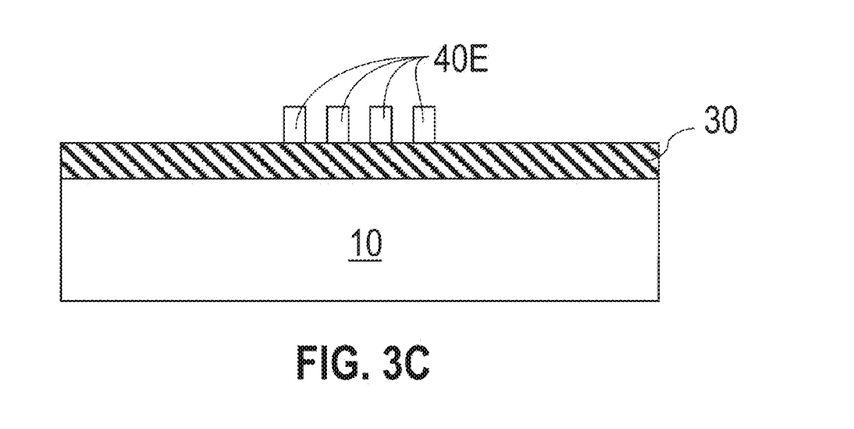

Referring to FIG. 3C, the inorganic electron beam sensitive oxide layer 40 is then developed employing an etchant or solvent that removes the at least one unexposed inorganic electron beam sensitive oxide portion 40U selective to the at least one exposed inorganic electron beam sensitive oxide portion 40E.

Figure 3D:
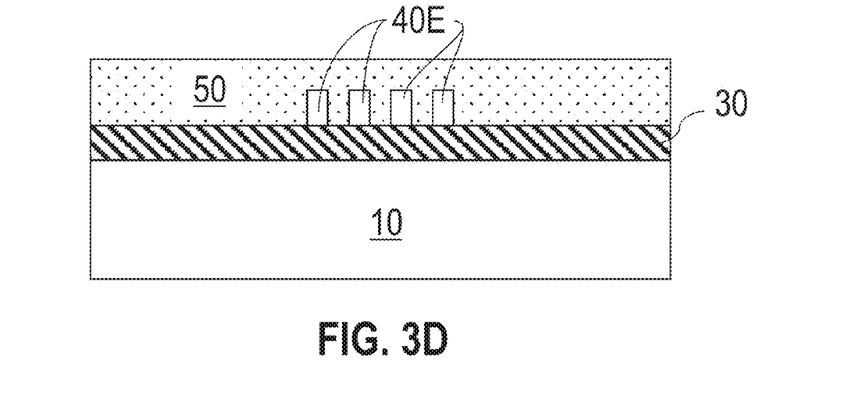

Referring to FIG. 3D, an optical resist layer 50 is applied to the at least one exposed inorganic electron beam sensitive oxide portion 40E and the carbon based material layer 30, for example, by spin coating. The optical resist layer 50 is self-planarizing, i.e., a top surface of the optical resist layer 50 is substantially planar after formation. The optical resist layer 50 comprises a material that is sensitive to at least to one of broadband ultraviolet radiation, 436 nm wavelength g-line ultraviolet radiation, 365 nm wavelength i-line ultraviolet radiation, 248 nm wavelength KrF excimer ultraviolet radiation, 193 nm wavelength ArF excimer ultraviolet radiation, 157 nm wavelength F2 laser, and extreme ultraviolet radiation (EUV). A bottom anti-reflective coating (BARC) layer (not shown) and/or a top anti-reflective coating (TARC) layer (not shown) may be employed as needed. The BARC layer may comprise any known BARC material that can be etched without affecting the at least one exposed inorganic electron beam sensitive oxide portion 40E. This includes developable anti-reflective coatings (ARCs) and ARCs that use plasma-based "open" processes provided that they do not affect the at least one exposed inorganic electron beam sensitive oxide portion 40E.

The optical resist layer 50 may be a positive resist, wherein exposed portions of the resist is removed during a subsequent development step, or a negative resist, wherein exposed portions of the resist remains on the carbon based material layer 30. The thickness of the optical resist layer 50 may be from about 200 nm to about 1,000 nm, and typically from 300 nm to about 600 nm, although lesser and greater thicknesses are explicitly contemplated herein also. The thickness and composition of the optical resist layer 50 may be optimized without regard to electron beam lithography.

Figure 3E:
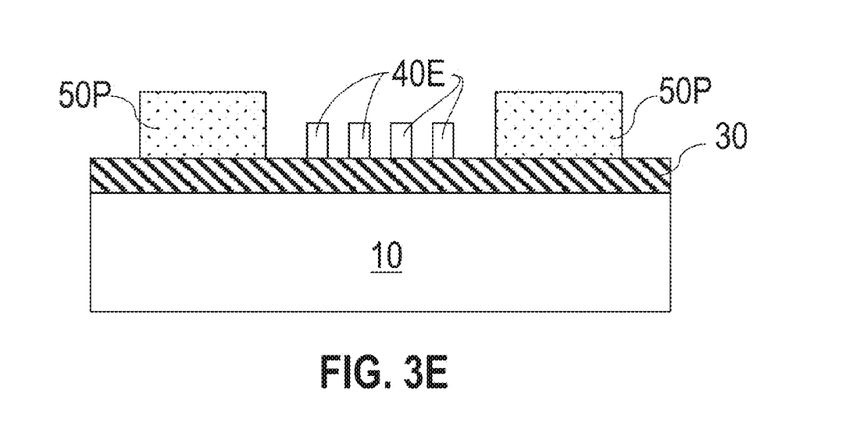

Referring to FIG. 3E, employing techniques of optical lithography, the optical resist layer 50 is exposed with an optical beam such as a deep ultraviolet (DUV) beam, a mid-ultraviolet (MUV) beam, an extreme ultraviolet (EUV) beam, or a broadband ultraviolet beam, and subsequently developed. The remaining portion of the optical resist layer 50, i.e., the exposed portion of the optical resist layer 50 in the case of a negative resist or the unexposed portion of the optical resist layer 50 in the case of a positive resist, is herein referred to as at least one patterned optical resist portion 50P. The pattern formed by the at least one patterned optical resist portion 50P has a resolution and feature sizes of the optical lithography.

Figure 3F:
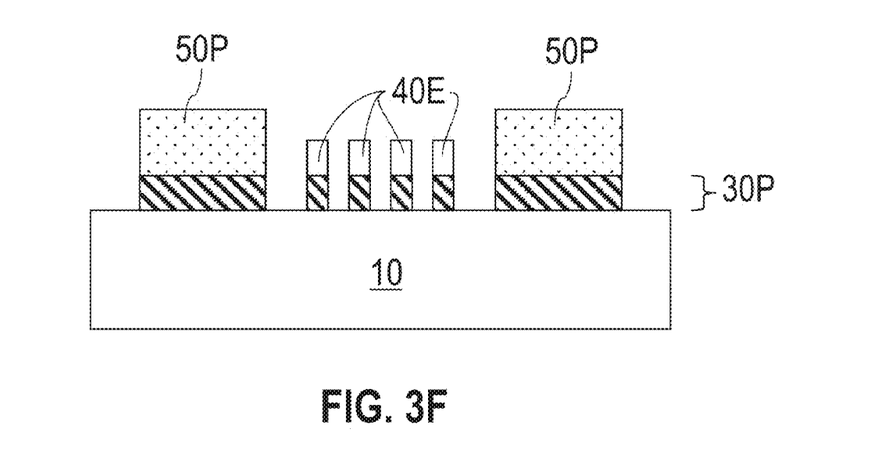

Referring to FIG. 3F, a first etch is performed to etch exposed portions of the carbon based material layer 30 to form a patterned carbon based material layer 30P. Preferably, the surfaces of the underlying layer 10 are exposed at the bottom of at least one trench formed in the patterned carbon based material layer 30P. A set of the exposed at least one inorganic electron beam sensitive oxide portion 40E and the at least one patterned optical resist portion 50P is employed as an etch mask during the first etch. Preferably, the first etch is a reactive ion etch. Other etches, such as a wet etch and a chemical dry etch (CDE) are also contemplated herein. The pattern of the at least one trench in the patterned carbon based material layer 30P match the pattern of the collective set, as seen from above in a top down view (not shown), comprising the exposed at least one inorganic electron beam sensitive oxide portion 40E and the at least one patterned optical resist portion 50P.

The simultaneous transfer of the pattern in the exposed at least one inorganic electron beam sensitive oxide portion 40E and the pattern in the at least one patterned optical resist portion 50P is herein referred to as a "single pattern transfer" in contrast with prior art methods in which an electron beam lithographic pattern and an optical lithographic pattern are separately transferred into a layer underneath or exposed in a single, common layer of resist.

Figure 3G:
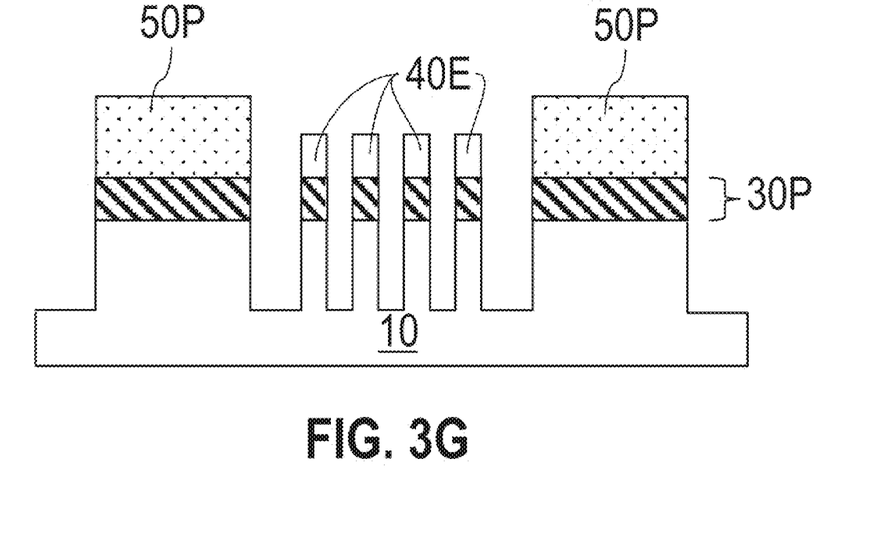

Referring to FIG. 3G, the pattern formed by the at least one trench in the patterned carbon based material layer 30P is transferred into the underlying layer 10 to form at least another trench in the underlying layer by a second etch. Preferably, the second etch is a reactive ion etch. Alternate etch processes such as a wet etch, a chemical dry etch, or physical sputter etch are also contemplated herein. The at least another trench replicates the pattern in the collective set comprising the exposed at least one inorganic electron beam sensitive oxide portion 40E and the at least one patterned optical resist portion 50P.

Figure 3H:
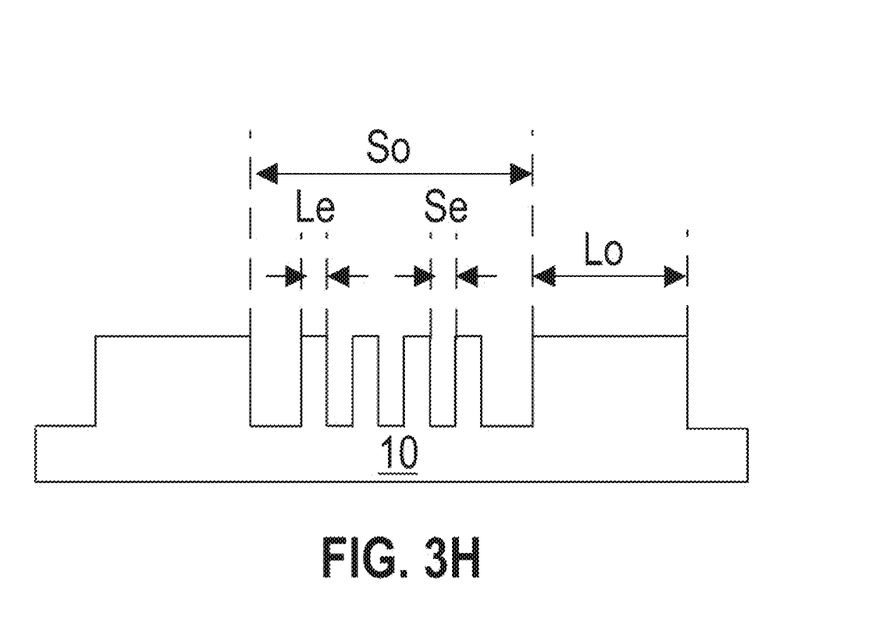

Referring to FIG. 3H, any remaining portions of the exposed at least one inorganic electron beam sensitive oxide portion 40E, the at least one patterned optical resist portion 50P, and the patterned carbon based material layer 30P are removed by ashing, a wet etch, a dry etch, or a combination thereof. For example, the patterned carbon based material layer 30P may be etched causing any material thereabove to be lifted off.

The underlying layer 10 contains the at least another trench having a composite pattern, which is a superposition of the pattern in the exposed at least one inorganic electron beam sensitive oxide portion 40E and the pattern of the at least one patterned optical resist portion 50P. Thus, the composite pattern may have feature sizes and resolution characteristic of the electron beam lithography and the optical lithography. For example, the composite pattern may contain a set of structures having an electron beam lithographic line width Le, i.e., a line width having characteristic dimensions of electron beam lithography, and having an electron beam lithographic spacing Se, i.e., a spacing having characteristic dimensions of electron beam lithography. At the same time, the composite pattern may contain another set of structures having an optical lithographic line width Lo, i.e., a line width having characteristic dimensions of optical lithography and an optical lithographic spacing So, i.e., a spacing having characteristic dimensions of optical lithography.

Since the compositions and the thicknesses of the at least one inorganic electron beam sensitive oxide portion 40 and the optical resist layer are optimized independent of each other, the resolution of electron beam lithographic features and the resolution of optical lithographic features may be optimized independent of each other as well. Thus, the inventive mixed lithography may achieve optimal resolution for both types of features, while employing only one pattern transfer.

Figures 4A, 4B:
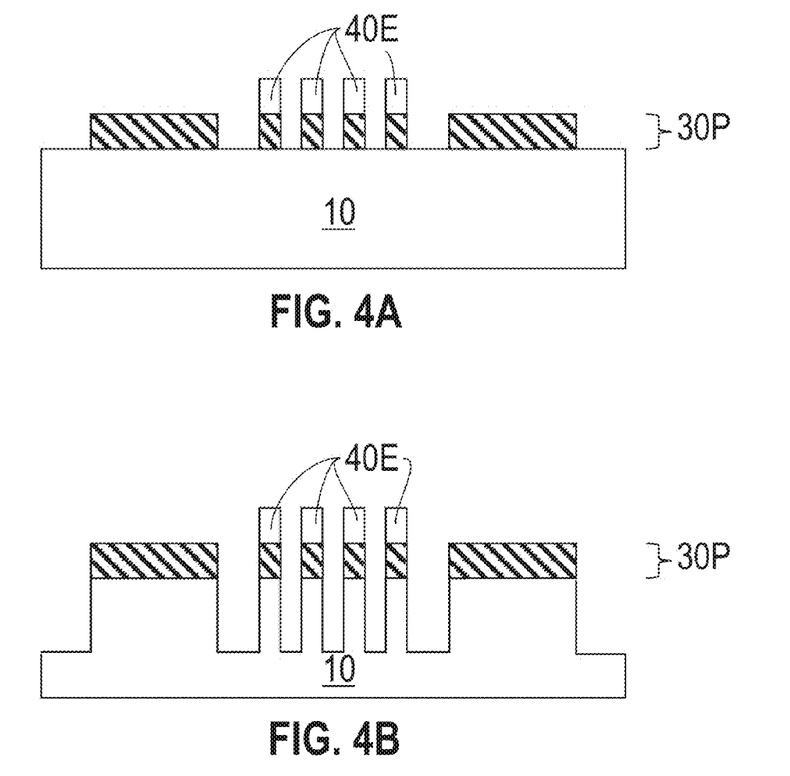
FIGS. 4A and 4B are sequential vertical cross-sectional views of a first variation on the first exemplary lithographic structure according to the present invention.

Referring to FIG. 4A, a first variation on the first exemplary lithographic structure according to a first variation of the first embodiment is shown, which is derived, by removing the at least one patterned optical resist portion 50P, from the first exemplary lithographic structure of FIG. 3E, i.e., the first lithographic structure of the first embodiment after the first etch and prior to the second etch. Employing the exposed at least one inorganic electron beam sensitive oxide portion 40E and the patterned carbon based material layer 30P as an etch mask, the underlying layer 10 may be etched by a second etch to form at least another trench as shown in FIG. 4B. The exposed at least one inorganic electron beam sensitive oxide portion 40E and the patterned carbon based material layer 30P.

Alternatively, the first lithographic structure of FIG. 4 may be obtained from the first exemplary lithographic structure of FIG. 3F by employing an etch chemistry that consumes all of the at least one patterned optical resist portion 50P during the second etch.

Figure 5:
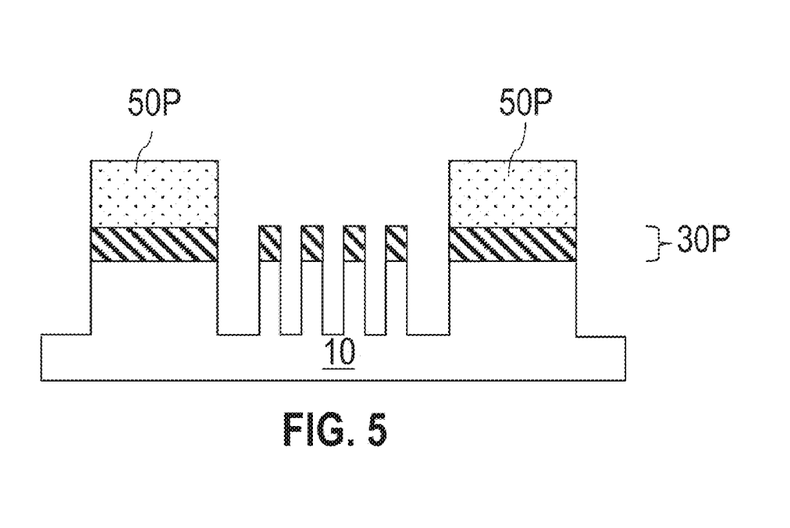

Referring to FIG. 5, a second variation on the first exemplary lithographic structure according to a second variation of the first embodiment is shown, which is derived from the first exemplary lithographic structure of FIG. 3F by employing an etch chemistry that consumes the exposed at least one inorganic electron beam sensitive oxide portion 40E during the second etch. After the second etch, the at least one patterned optical resist portion 50P and the patterned carbon based material layer 30P are removed.

Figure 6:
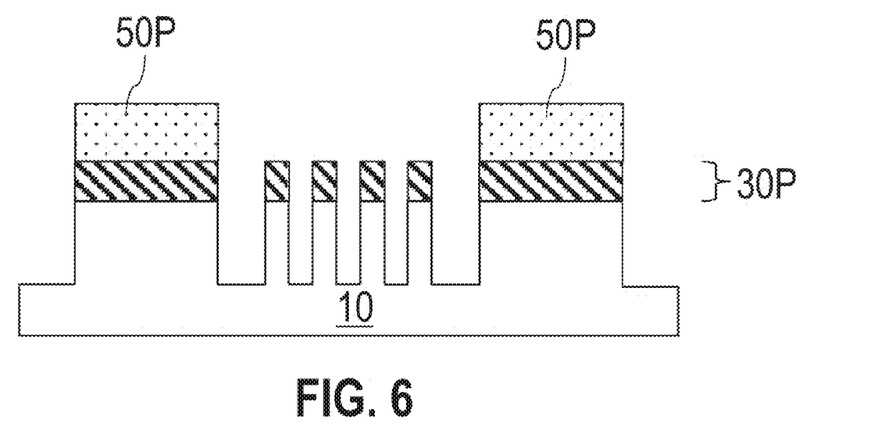

Referring to FIG. 6, a third variation on the first exemplary lithographic structure according to a third variation of the first embodiment is shown, which is derived from the first exemplary lithographic structure of FIG. 3F by employing an etch chemistry that consumes all of the exposed at least one inorganic electron beam sensitive oxide portion 40E and partially consumes the at least one patterned optical resist portion 50P the during the second etch. The remaining portion of the at least one patterned optical resist portion 50P and the carbon based material layer 30P are removed after the second etch.

Figure 7:
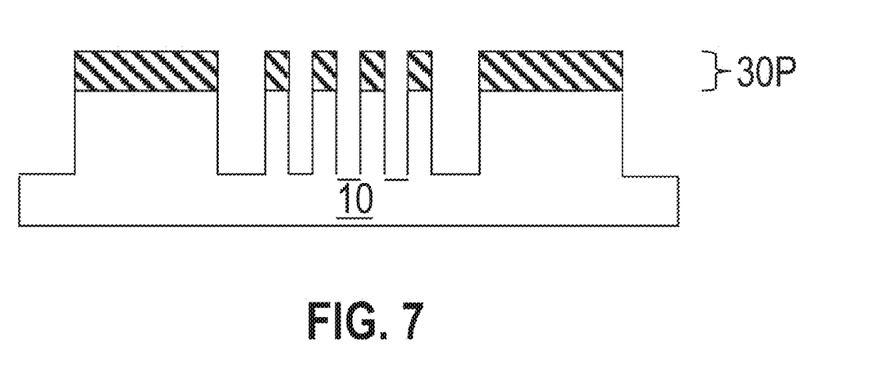

Referring to FIG. 7, a fourth variation on the first exemplary lithographic structure according to a fourth variation of the first embodiment is shown, which is derived from the first exemplary lithographic structure of FIG. 3F by employing an etch chemistry that consumes all of the exposed at least one inorganic electron beam sensitive oxide portion 40E and all of the at least one patterned optical resist portion 50P the during the second etch. Thus, only the patterned carbon based material layer 30P is removed after the second etch.

Figure 8A:
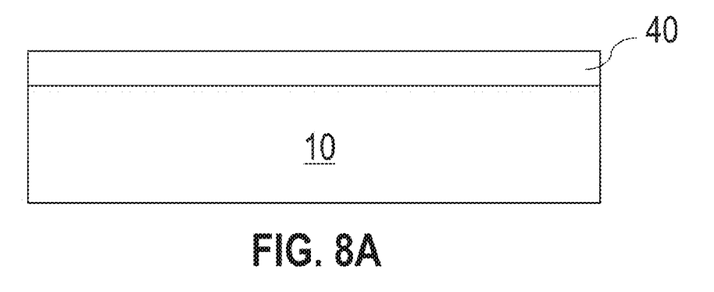
FIGS. 8A-8G are sequential vertical cross-sectional views of a first exemplary lithographic structure according to the present invention at various stages of a manufacturing process.

Referring to FIG. 8A, a second exemplary lithographic structure according to a second embodiment of the present invention comprises a stack of an underlying layer 10 and an inorganic electron beam sensitive oxide layer 40. The composition of the underlying layer 10 may be the same as in the first embodiment. The composition and thickness of the inorganic electron beam sensitive oxide layer 40 may be the same as in the first embodiment as well. Unlike the first embodiment, a carbon based material layer is not employed in the second exemplary lithographic structure. Instead, the inorganic electron beam sensitive oxide layer 40 is formed directly on the underlying layer 10.

Figure 8B:
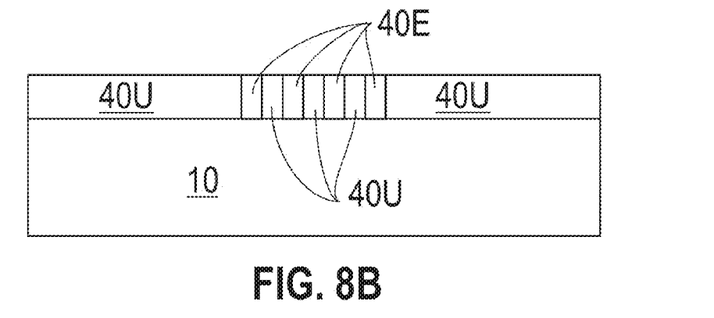

Referring to FIG. 8B, employing techniques of electron beam lithography, at least one portion of the inorganic electron beam sensitive oxide layer 40 is exposed with an electron beam to form at least one exposed inorganic electron beam sensitive oxide portion 40E as in the first embodiment. The complement of the at least one exposed inorganic electron beam sensitive oxide portion 40P within the at least exposed portions of the inorganic electron beam sensitive oxide layer 40 constitutes at least one unexposed inorganic electron beam sensitive oxide portion 40U. The pattern formed by the at least one exposed inorganic electron beam sensitive oxide portion 40E has a resolution and feature sizes of the electron beam lithography.

Figure 8C:
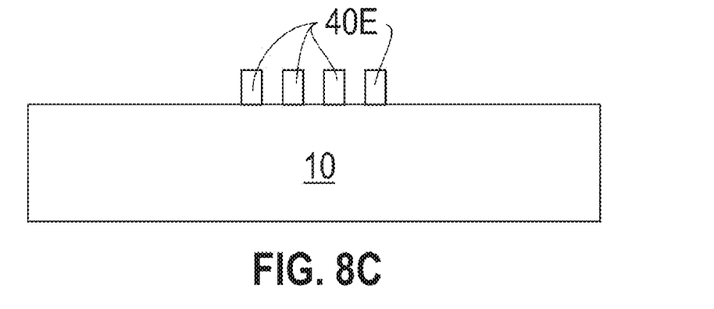

Referring to FIG. 8C, the inorganic electron beam sensitive oxide layer 40 is then developed as in the first embodiment.

Figure 8D:
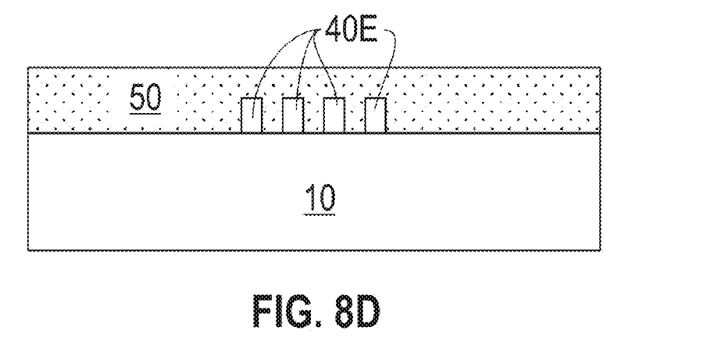

Referring to FIG. 8D, an optical resist layer 50 is applied to the at least one exposed inorganic electron beam sensitive oxide portion 40E and the underlying layer 10, for example, by spin coating. The chemical and mechanical properties and the thickness of the optical resist layer 50 may be the same as in the first embodiment.

Figure 8E:
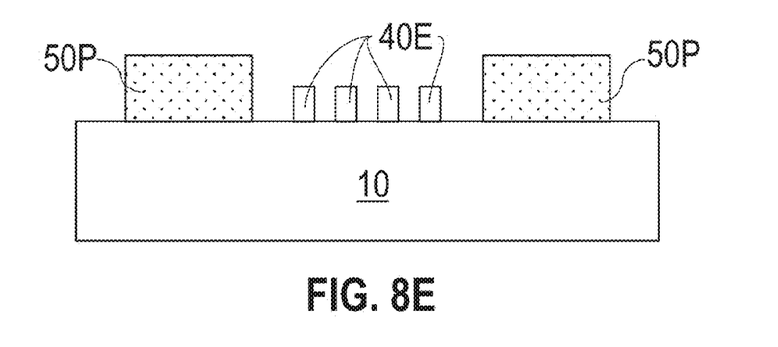

Referring to FIG. 8E, employing techniques of optical lithography, the optical resist layer 50 is exposed with an optical beam such as a deep ultraviolet (DUV) beam, a mid-ultraviolet (MUV) beam, an extreme ultraviolet (EUV) beam, or a broadband ultraviolet beam, and subsequently developed as in the first embodiment. The remaining portion of the optical resist layer 50 constitutes at least one patterned optical resist portion 50P. The pattern formed by the at least one patterned optical resist portion 50P has a resolution and feature sizes of the optical lithography.

Figure 8F:
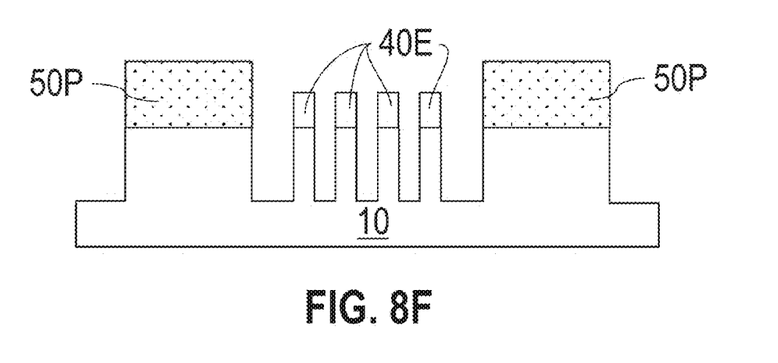

Referring to FIG. 8F, exposed portions of the underlying layer 10 are etched to form at least one trench in the underlying layer 10. A set of the exposed at least one inorganic electron beam sensitive oxide portion 40E and the at least one patterned optical resist portion 50P is employed as an etch mask during the etch. Preferably, the etch is a reactive ion etch. Other etches, such as a wet etch, a chemical dry etch (CDE), or physical sputter etch are also contemplated herein. The pattern of the at least one trench in the underlying layer 10 match the pattern of the collective set, as seen from above in a top down view (not shown), comprising the exposed at least one inorganic electron beam sensitive oxide portion 40E and the at least one patterned optical resist portion 50P.

Figure 8G:
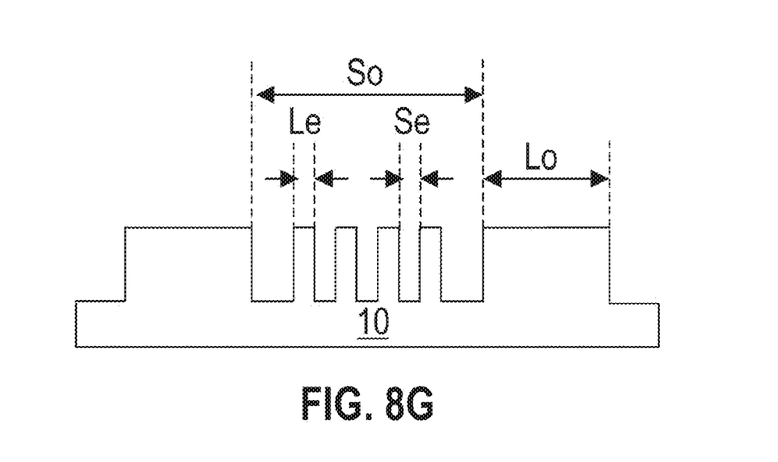

Referring to FIG. 8G, any remaining portions of the exposed at least one inorganic electron beam sensitive oxide portion 40E and the at least one patterned optical resist portion 50P are removed by ashing, a wet etch, a dry etch, or a combination thereof.

The underlying layer 10 contains the at least one trench having a composite pattern, which is a superposition of the pattern in the exposed at least one inorganic electron beam sensitive oxide portion 40E and the pattern of the at least one patterned optical resist portion 50P as in the first embodiment. The composite pattern may have feature sizes and resolution characteristic of the electron beam lithography and the optical lithography as in the first embodiment. The compositions and the thicknesses of the at least one inorganic electron beam sensitive oxide portion 40 and the optical resist layer are optimized independent of each other, and the resolution of electron beam lithographic features and the resolution of optical lithographic features may be optimized independent of each other as in the first embodiment.

Figure 9:
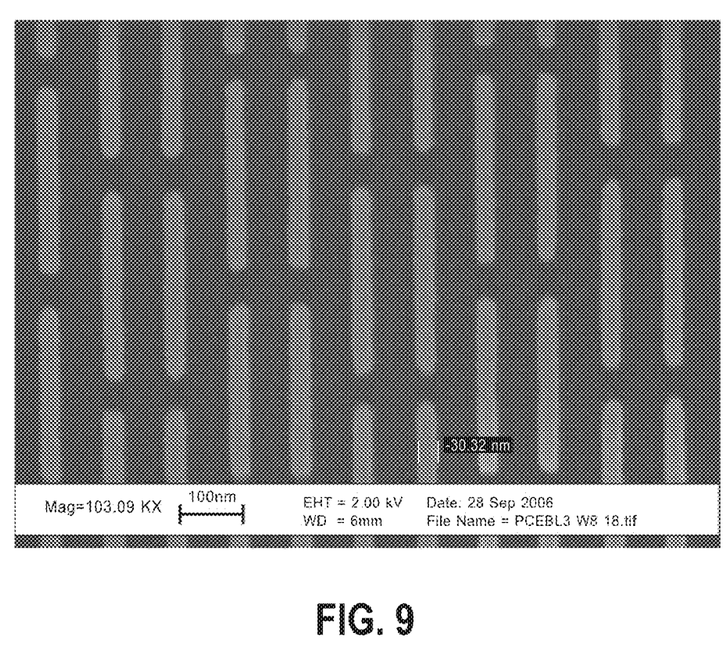
FIG. 9 is a top-down scanning electron micrograph (SEM) of an exemplary developed pattern of an inorganic electron beam sensitive oxide layer according to the present invention.

Referring to FIG. 9, a top-down scanning electron micrograph (SEM) of an exemplary developed pattern of inorganic electron beam sensitive oxide portions according to the present invention shows a pattern without any collapsed portion. The 30 nm line, 100 nm pitch pattern that failed to print using the NEB process is shown printed correctly with HSQ in the SEM in FIG. 9. The inventive mixed lithography addresses both problems of the negative-tone chemically amplified resist based approach. The inorganic resist in the inorganic electron beam sensitive oxide layer 40 typically delivers an intrinsically higher resolution compared to the negative-tone chemically amplified resists. The inorganic resist also has significantly higher contrast. These qualities allow the inorganic electron beam sensitive oxide layer 40 to print patterns with features on the order of 10 nm line/space. Furthermore, the fact that the electron beam and optical exposures are now decoupled permits optimization of each process independently. This allows high quality optical and electron beam patterns to be transferred into the carbon based material layer 30 and/or the underlying layer 10 simultaneously using a single reactive ion etch process.

The lack of any collapsed portion of the inorganic electron beam sensitive oxide material is due to a high etch-ratio of the inorganic electron beam sensitive oxide material, i.e., a relatively small amount of the inorganic electron beam sensitive oxide material may be removed, while a substantial amount of an underlying layer such as a carbon based material layer or an underlying layer is removed during an etch. For a given electron beam lithographic dimension, the height of the inorganic electron beam sensitive oxide portion is less than the height of a patterned conventional negative-tone chemically amplified resist. Thus, for the given electron beam lithographic dimension, the aspect ratio, i.e., the height to width ratio, of the inorganic electron beam sensitive oxide portions is less than the aspect ratio of the patterned conventional negative-tone chemically amplified resist, and consequently, the inorganic electron beam sensitive oxide portions are more stable against pattern collapse than the patterned conventional negative-tone chemically amplified resist. Enhanced resistivity to pattern collapse improves the resolution and the etch depth of the inventive mixed lithography relative to other mixed lithography known in the art.

Figure 10A:
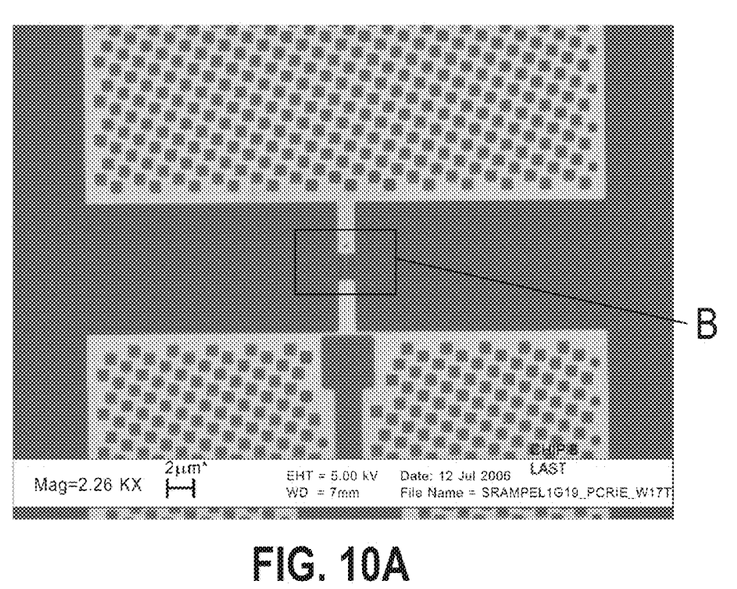
FIG. 10A is a top-down scanning electron micrograph (SEM) of an exemplary semiconductor structure containing a gate pattern in the region labeled with "B."
Figure 10B:
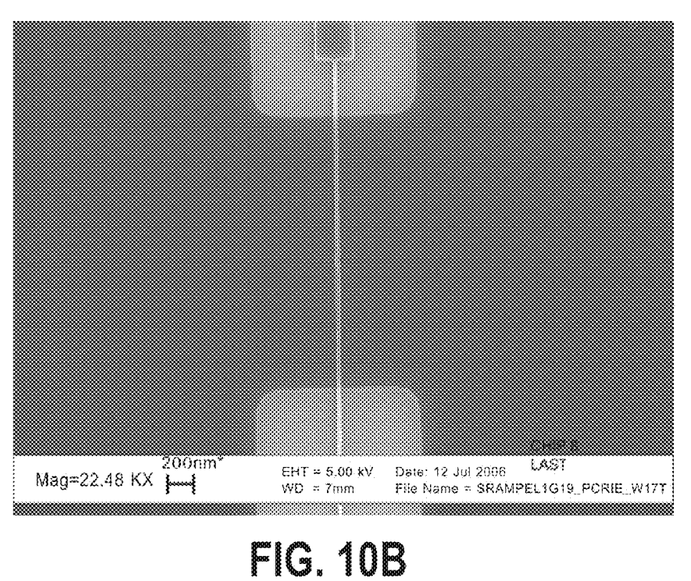
FIG. 10B is a magnified view of the SEM in FIG. 10A.

Referring to FIG. 10A, a top-down scanning electron micrograph (SEM) of an exemplary semiconductor structure containing a gate pattern and manufactured with processing steps of the inventive mixed lithography is shown. FIG. 10B shows a magnified view of the region labeled with "B" in FIG. 10A. A very sharply defined line having an electron beam lithographic line width of 7 nm is seen in FIG. 10B.

The SEM in FIG. 10B demonstrates how the inventive mixed lithography employing dual resists can be applied to gate patterning for a complementary metal-oxide-semiconductor (CMOS) device application. 248 nm DUV optical lithography is used to print the lower resolution gate contact pattern using UVN30™ resist and a BARC layer, while HSQ is used to define a 30 nm gate over an active region of the device. Both exposures were performed on a layer of nearly frictionless carbon (NFC). The composite image of the two resists was used to transfer into the NFC layer which in turn served as a mask for the dry etching of a gate stack.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A lithographic structure comprising:
   a carbon based material layer vertically abutting an underlying layer;
   at least one inorganic electron beam sensitive oxide portion having a pattern and vertically abutting said carbon based material layer; and
   at least one patterned optical resist portion having another pattern and located on said carbon based material layer.

2. The lithographic structure of claim 1, wherein said at least one patterned optical resist portion is disjoined from said at least one inorganic electron beam sensitive oxide portion.

3. The lithographic structure of claim 1, wherein said at least one patterned optical resist portion is sensitive to a radiation selected from broadband ultraviolet radiation, 436 mu wavelength g-line ultraviolet radiation, 365 nm wavelength i-line ultraviolet radiation, 248 nm wavelength KrF excimer ultraviolet radiation, 193 nm wavelength ArF excimer ultraviolet radiation, 157 nm wavelength $F_2$ laser beam, or extreme ultraviolet radiation.

4. The lithographic structure of claim 1, wherein said inorganic electron beam sensitive oxide layer comprises hydrogen silsesquioxane (HSQ).

5. The lithographic structure of claim 1, wherein said inorganic electron beam sensitive oxide layer comprises aluminum fluoride, zinc oxide, or titanium oxide.

6. The lithographic structure of claim 1, wherein said carbon based material layer comprises near frictionless carbon (NFC), an organic carbon containing material or graphite.

7. The lithographic structure of claim 1, wherein said at least one inorganic electron beam sensitive oxide portion comprises hydrogen silsesquioxane (HSQ), aluminum fluoride, zinc oxide, or titanium oxide.

8. A lithographic structure comprising:
   at least one inorganic electron beam sensitive oxide portion having a pattern and vertically abutting an underlying layer; and
   at least one patterned optical resist portion having another pattern and located on said underlying layer.

9. The lithographic structure of claim 8, wherein said at least one inorganic electron beam sensitive oxide portion comprises hydrogen silsesquioxane (HSQ), aluminum fluoride, zinc oxide, or titanium oxide.

10. The lithographic structure of claim 8, wherein said underlying layer comprises at least one trench having a composite pattern comprising said pattern and said another pattern.

* * * * *